(12) United States Patent
Holsteyns et al.

(10) Patent No.: US 8,551,251 B2
(45) Date of Patent: Oct. 8, 2013

(54) ULTRASONIC TREATMENT METHOD AND APPARATUS

(75) Inventors: Frank Holsteyns, Kortenberg (BE); Alexander Lippert, Villach (AT)

(73) Assignee: Lam Research AG, Villach (AT)

( * ) Notice: Subject to any disclaimer, the term of this patent is extended or adjusted under 35 U.S.C. 154(b) by 0 days.

(21) Appl. No.: 13/096,809

(22) Filed: Apr. 28, 2011

(65) Prior Publication Data
US 2012/0273363 A1 Nov. 1, 2012

(51) Int. Cl.
*B08B 3/12* (2006.01)

(52) U.S. Cl.
USPC ............... 134/1; 134/1.3; 134/137; 134/182; 134/183

(58) Field of Classification Search
None
See application file for complete search history.

(56) References Cited

U.S. PATENT DOCUMENTS

| 5,938,612 | A | 8/1999 | Kline-Schoder et al. |
| 6,720,844 | B1 | 4/2004 | Lakin |
| 6,845,778 | B2 | 1/2005 | Boyd et al. |
| 7,105,985 | B2 * | 9/2006 | Beck et al. ............... 310/323.19 |
| 7,358,831 | B2 | 4/2008 | Larson, III et al. |
| 2004/0163682 | A1 | 8/2004 | Boyd et al. |
| 2006/0180172 | A1 * | 8/2006 | Kundalgurki ..................... 134/1 |
| 2007/0085629 | A1 | 4/2007 | Kando |

OTHER PUBLICATIONS

Lakin, K.M., "Thin Film Resonator Technology", TFR Technologies, Inc. May 26, 2003, pp. 1-14.
Azar, Lawrence, "Cavitation in Ultrasonic Cleaning and Cell Disruption", Controlled Environments, www.cemag.us, Feb. 2009, pp. 14-17.
International Search Report, dated Sep. 12, 2012, from corresponding PCT application.

* cited by examiner

Primary Examiner — Michael Kornakov
Assistant Examiner — Ryan Coleman
(74) Attorney, Agent, or Firm — Young & Thompson

(57) ABSTRACT

Improved methods and apparatus for cleaning substrates and enhancing diffusion limited reaction at substrate surfaces use piezoelectric transducers operating in the gigasonic domain. The resonator assemblies include plural transducer stacks each including a thin film piezoelectric element coupled to a resonator plate that faces the substrate. At the disclosed frequencies and powers used, Eckart or Rayleigh streaming can be induced in a liquid treatment medium without substantial generation of cavitation.

17 Claims, 4 Drawing Sheets

ULTRASONIC TREATMENT METHOD AND APPARATUS

BACKGROUND OF THE INVENTION

1. Field of the Invention

The invention relates to the field of ultrasonic (including megasonic and gigasonic) treatment of substrate surfaces.

2. Description of Related Art

Removal of particulate contaminants from a semiconductor substrate can be accomplished by ultrasonic cleaning. When the frequency of ultrasound is close to or above 1,000 kHz (1 MHz) it is often referred to as "megasonic". When the frequency of ultrasound is close to or above 1,000 MHz (1 GHz) it can be referred to as "gigasonic". Conventional techniques for ultrasonic cleaning of semiconductor wafers rely upon cavitation effects, in which the ultrasonic energy induces the formation of small bubbles, the collapse of which releases high quantities of energy into the surrounding fluid, and promotes cleaning of substrates.

However, excessive cavitation energy near a substrate having delicate surfaces or components can also cause substrate damage.

SUMMARY OF THE INVENTION

The present invention provides methods and apparatus for applying ultrasonic waves to a semiconductor substrate using resonators whose frequency domain induces acoustic streaming in the surrounding medium without causing substantial cavitation. These resonators comprise a resonator plate, on which transducer elements are formed by thin film techniques such as PVD (physical vapor deposition), CVD (chemical vapor deposition), and sputtering.

An example for a source of acoustic energy is a piezoelectric element coupled to a resonator plate, the piezoelectric element driven by a high frequency generator.

The methods and apparatus according to the invention are useful not only for cleaning substrates but also for enhancing diffusion limited reactions at an interface, such as during electrochemical reactions (for example deposition of copper on a semiconductor wafer), etching and rinsing.

An apparatus according to the present invention may comprise a holder for the substrate, an acoustic resonator assembly positioned so as to be spaced a predetermined distance from a substrate when held by the holder, a dispenser for supplying liquid into a gap between the substrate when held by the holder and the acoustic resonator and a source of acoustic energy capable of supplying the acoustic resonator assembly with acoustic energy having a frequency of at least about 100 MHz, preferably at least 500 MHz, more preferably at least 1 GHz, and most preferably in a range from 500 MHz to 5 GHz.

A particularly useful embodiment of the inventive apparatus is in a spin chuck for supporting a semiconductor wafer in a process module for single wafer wet processing.

The acoustic resonator assembly preferably comprises at least one piezoelectric element having a thickness in the range from 200 nm to 20 microns, preferably 500 nm to 10 microns, and more preferably 1-5 microns. The piezoelectric element may be a layer formed as in film bulk acoustic resonator (FBAR) filters.

When such an acoustic resonator assembly is positioned at a distance in the range from 100 μm to 1000 μm from the substrate, acoustic streaming, such as Eckart or Rayleigh streaming can be induced in the process liquid without substantial associated cavitation and bubble formation in the liquid.

A method according to the invention of treating a substrate may comprise positioning a substrate on a holder, positioning an acoustic resonator assembly a predetermined distance from a surface of the substrate, dispensing a treatment liquid into a gap between the acoustic resonator assembly and the substrate, and supplying the acoustic resonator assembly with acoustic energy having a frequency of at least about 100 MHz.

If the methods according to the invention are used for substrate cleaning, then the process liquid could be for example deionized water, whereas when the methods are used to enhance a diffusion-limited reaction at the substrate-liquid interface, then the treatment liquid could be for example a solution containing metal ions, preferably copper ions, for the electrodeposition of metal, preferably copper, onto a surface of the substrate, e.g., a semiconductor wafer.

Preferred embodiments of the present invention therefore provide improved methods and apparatus for cleaning substrates and enhancing diffusion limited reaction at substrate surfaces using piezoelectric transducers operating in the gigasonic domain. The resonator assemblies preferably include plural transducer stacks each including a thin film piezoelectric element coupled to a resonator plate that faces the substrate. At the disclosed frequencies and powers used, Eckart or Rayleigh streaming can be induced in a liquid treatment medium without substantial generation of cavitation.

BRIEF DESCRIPTION OF THE DRAWINGS

The accompanying drawings are included to provide a fuller understanding of the invention. The drawings illustrate embodiments of the invention and together with the description serve more fully to explain the principles of the embodiments of the invention.

DETAILED DESCRIPTION

Figure 1:
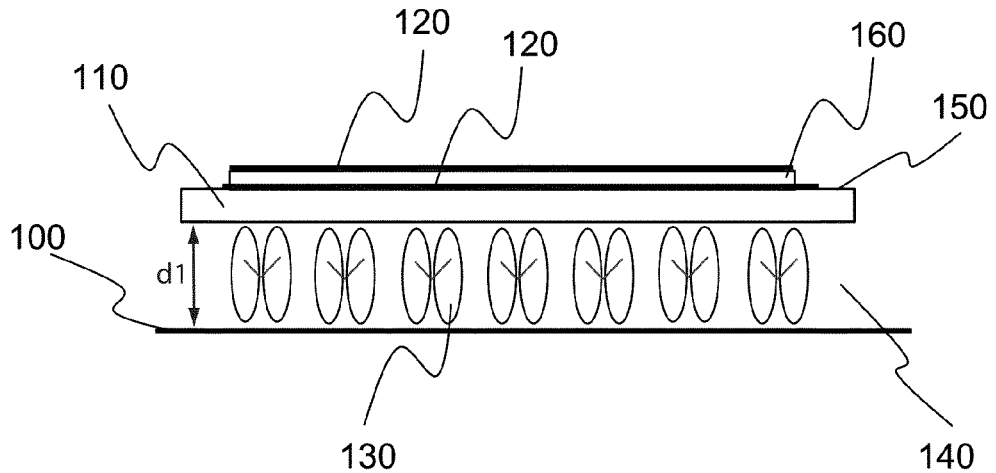
FIG. 1 is a schematic side view of an acoustic resonator according to one embodiment of the present invention positioned in relation to a substrate to be processed.

When a high frequency resonator contacts a liquid, strong currents of the liquid appear in front of the vibrating parts of the resonator. These currents are known as acoustic streaming or more specifically as Eckart or Rayleigh streaming, since they originate from second-order effects caused by acoustic disturbances in the fluid.

This acoustic streaming promotes the following phenomena:

1) initiating or maintaining a flow, which is beneficial for transportation or mixing;

2) enhancing diffusion limited reactions at an interface, which will be beneficial for electrochemical reactions (such as the deposition of Cu), etching, rinsing; and 3) creating shear stress at an interface, which can for example lead to the removal of particulate contamination from a surface.

The operational frequencies for the resonators according to the invention preferably are selected to be within 100 MHz and 5 GHz and the operational power up to 10 W/cm². At these higher frequencies and those power levels essentially no cavitation will be initiated in the liquid between the resonator and the substrate. Such cavitations could influence the process negatively, as discussed above.

The high frequency resonator is in this case a device, which converts electrical energy into mechanical energy. This means that an oscillating electrical signal will cause an appropriately chosen piezoelectric material to undergo oscillations in geometrical changes. If adequately coupled, the displacement of the piezoelectric material will excite acoustic waves in an adjacent medium. The waves will propagate from the resonator into the medium. As the acoustic waves travel through the medium, they may be absorbed. Consequently, the momentum absorbed from the acoustic field will manifest itself as a flow of the liquid in the direction of the sound field, termed acoustic streaming.

The flow speed is for most types of fluids and over a large frequency range proportional to sound wave intensity and the acoustic attenuation coefficient. The acoustic attenuation coefficient α can be expressed as:

$$\alpha = \omega^2/(2\rho_0 c_0^3)[4/3\mu + \mu']$$

where ω is the angular velocity, $\rho_0$ is the equilibrium value of the liquid density, $c_0$ is the equilibrium speed of sound, μ is the shear viscosity and μ' the dilatational viscosity. Consequently, high flow speeds will require a high frequency resonator. In combination with an acceptable attenuation length, in the order of 100 μm to 1000 μm or more, frequencies between 100 MHz and 5 GHz are best suited.

Typically, streaming vortices with a velocity up to 1 m/s can be generated, and this close to the substrate (<100 μm) which results in a very high shear rate at the substrate (above 10000 1/s). These vortices play an important role in the enhancement of diffusion limited processes (such as some etching processes and most of the electrochemical processes), to speed up rinsing processes (to transport contamination away from a substrate) and to remove particulate contamination from a substrate.

Referring now to the drawings, FIG. 1 shows a schematic side view of a first embodiment of a transducer plate. An acoustic resonator stack 150 is positioned adjacent to a substrate 100. Substrate 100 may be for example a 300 mm semiconductor wafer positioned in a process module for single wafer wet processing. The distance d1 between the resonator body 110 and the substrate varies typically between 100 μm and 1000 μm and is filled with liquid 140 (e.g. 500 μm, although that distance is exaggerated in FIG. 1 for purposes of explanation). The acoustic resonator stack 150 comprises a resonator body 110, which can be for instance sapphire, silicon or quartz and on the back side, a layer of piezoelectric material 160 is present, which can be for example aluminium nitride, PZT (lead zirconium titanate), lithium niobate or zinc oxide, sandwiched between two electrodes 120. When this acoustic resonator stack is driven electrically, an acoustic wave will be launched in the liquid and consequently acoustic streaming 130 occurs in the liquid.

Reference herein to the resonator body or resonator plate connotes the solid member that transmits ultrasound from the piezoelectric layer to the processing liquid. The components referred to herein as resonator islands may also be referred to as resonator regions, and these terms generally connote piezoelectric layers that cover only portions of the resonator rather than the entire resonator. A piezoelectric layer will typically comprise a plurality of layers having piezoelectric properties, and may also be referred to as a piezoelectric stack. An acoustic resonator assembly thus comprises a body (or plate), a piezoelectric layer, and two opposing electrodes for electrically agitating the piezoelectric layer. The term transducer generally refers to the resonator plate and the piezoelectric stack.

The body 110 has a preferred thickness, ranging from 20 μm (to ensure sufficient mechanical strength of the device) to 675 μm (thickness of the available substrate), in this example a 500 μm thick sapphire was used.

Each acoustic resonator stack 150 is typically made out of a body, electrodes and piezoelectric material. As discussed earlier, the body can be made out of sapphire, silicon, quartz or combination of these materials, and also a thin layer of quartz may optionally be deposited on the front and/or back side of the sapphire. The electrodes are typically made of aluminium, copper, tungsten, molybdenum or platinum/titanium and the piezoelectric material can for example be ZnO, AlN, GaAs or PZT. Therefore many different stacks can be created by combining these different materials.

Resonator stacks 150 may be fabricated using techniques described in connection with bulk acoustic wave (BAW) filters, used in telecommunications, and more particularly techniques described in connection with thin film bulk acoustic wave resonators (FBAR).

Alternatively, both electrodes 120 can be positioned on the same side of piezoelectric layer 160, in which case they are desirably configured as an interdigitated array as described in connection with surface acoustic wave (SAW) filters in the telecommunications field.

Figure 2A:
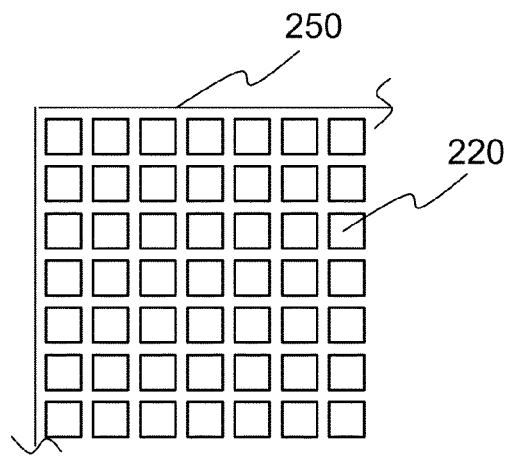
FIG. 2a and FIG. 2b are respectively schematic bottom plan and side views of an alternative embodiment of an acoustic resonator assembly.
Figure 2B:
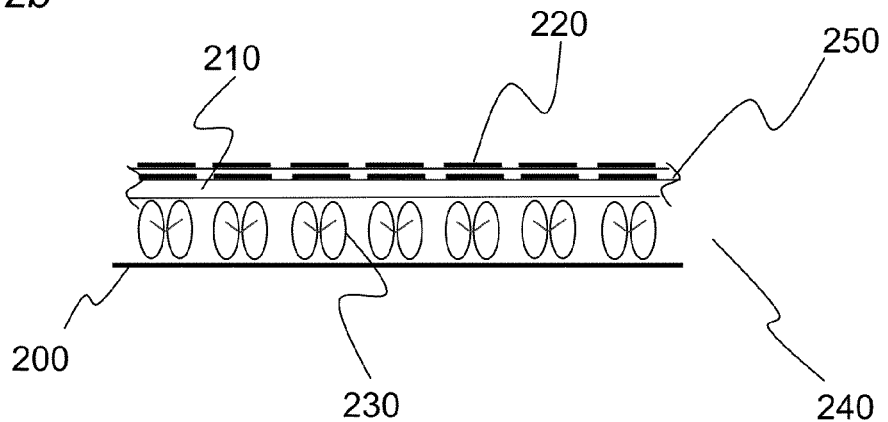
Figure 3:
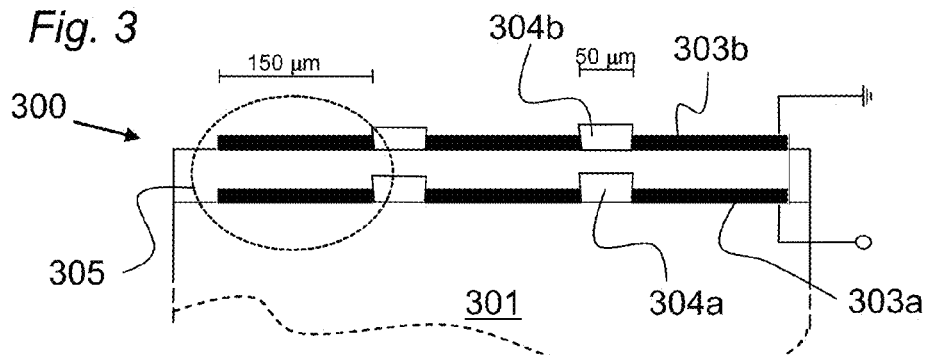
FIG. 3 shows a cross section of three individual resonator islands 305, as part of a transducer stack according to a further embodiment of the invention.

FIG. 2a and FIG. 2b show an alternative embodiment of the resonator plate where the acoustic resonator stack 250 comprises many small piezoelectric islands 220. The islands, as shown in FIG. 3, are typically sized on the order of 150 μm by 150 μm and are two-dimensionally ordered in series of arrays. The dimensions of the plurality of these islands are advantageously up to about 1 cm by 1 cm.

Piezoelectric islands 220 are typically generated by patterning the deposited electrodes in small defined areas and electrical connections between them on a body 210, as shown in greater detail in FIG. 3. Each island can launch acoustic waves into the liquid 240 present between the substrate 200 and the acoustic resonator stack 250. This will lead to the creation of acoustic streaming 230.

FIG. 3 shows a cross section of three individual resonator islands 305, as part of a transducer plate 300. Each island has a typical width of 150 μm×150 μm and is created by patterning the deposited electrodes 303. To drive the islands electrically in series or parallel, the patterning includes also the formation of the electrical connections 304 between the various islands, which are separated from one another by a distance of 50 μm.

The electrodes 303a and 303b are in this example made of aluminium and are sputtered and patterned on a body 301 made of Al$_2$O$_3$ (sapphire). AlN (aluminium nitride) is deposited as piezoelectric material 302 and covered again by another patterned layer of Aluminium.

If the electrodes are to be made of copper rather than aluminium, then the electrodes and the connections to the electrodes are advantageously made by first forming corresponding vias and trenches in an insulating layer formed on the body made of sapphire or the like. The vias and trenches are then filled with copper and the excess copper removed by CMP, as has been described in connection with dual damascene techniques for making interconnect layers in semiconductor devices.

As noted above, transducer arrays according to the present invention may be made by techniques based on those used to make BAW filters, as described for example in Lakin, "Thin Film Resonator Technology," *IEEE* 2003 *FCS-EFTF Paper WelA*-4 (2003).

In a first step, a sapphire wafer (500 μm thickness) is used as body, on which 100 nm of SiO$_2$ is deposited. In a next step, a 300 nm film of aluminium is deposited on the SiO$_2$-layer by DC-sputtering and patterned corresponding to the designed bottom electrode pattern 303a of the resonator, into interconnection lines 304a and active areas.

In a subsequent step, a layer of AlN is deposited as resonator by RF-sputtering. The thickness of the resonator layer is preferably chosen to be approximately half of the wavelength of the acoustic wave to be generated in the liquid medium, or an odd multiple of that half wavelength, with the half wavelength thickness in this case being about 3 μm. The thickness of the resonator layer is preferably substantially constant over its entire surface.

In a following step a further 300 nm layer of aluminium is deposited as a second electrode layer 303b by DC-sputtering, and patterned according to the top electrode pattern, to produce a second set of interconnection lines 304b and active areas 303b.

Electrodes 303 may then be directly connected to a frequency generator.

Examples for materials of the deposited transducer stacks are given in Table 1:

TABLE 1

| Example | Body | Electrode | interconnection lines | resonator layer |
| --- | --- | --- | --- | --- |
| 1 | sapphire | Al | Al | AlN |
| 2 | Silicon | Al | Al | AlN |
| 3 | Quartz | Al | Al | AlN |
| 4 | sapphire | Al | Al | PZT |
| 5 | Silicon | Al | Al | PZT |
| 6 | Quartz | Al | Al | PZT |
| 7 | sapphire | Al | Al | ZnO |
| 8 | Silicon | Al | Al | ZnO |
| 9 | Quartz | Al | Al | ZnO |

Patterning of the body, electrodes and piezoelectric layer may each be performed by photolithographic processes involving forming a mask exposing the areas to be removed. Thereafter the areas to be removed are typically removed by dry etching such as plasma etching.

Figure 4:
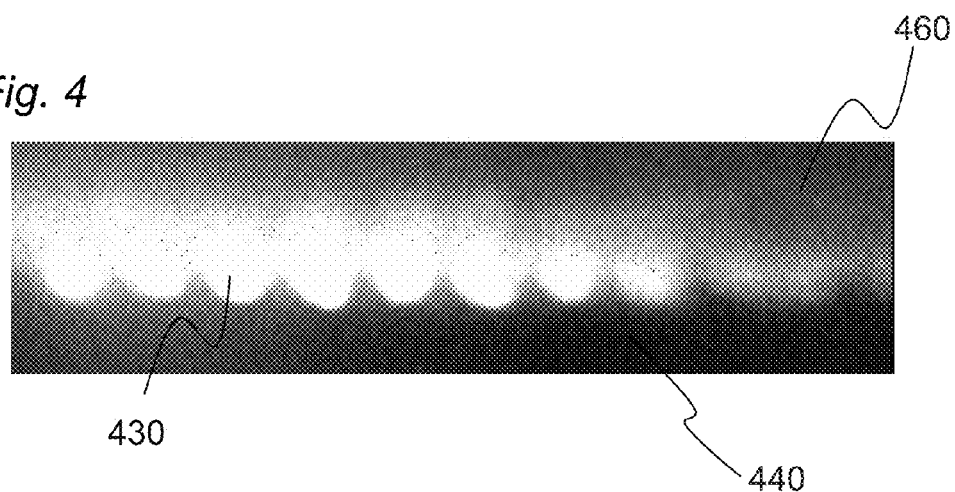
FIG. 4 is a micrograph of acoustic streaming generated in a liquid by a sequence of resonators according to an embodiment of the present invention.

FIG. 4 shows the acoustic streaming 430 generated in the liquid 460 by a sequence of resonators 440, all driven simultaneously at 1.9 GHz. Fluorescing particles were added to the liquid flow, in order to visualize the hydrodynamics of the system. Above the resonators, many vortices could be observed, with a dimension about 100 μm. Each vortex represents one piezoelectric island of the resonator.

Figure 5:
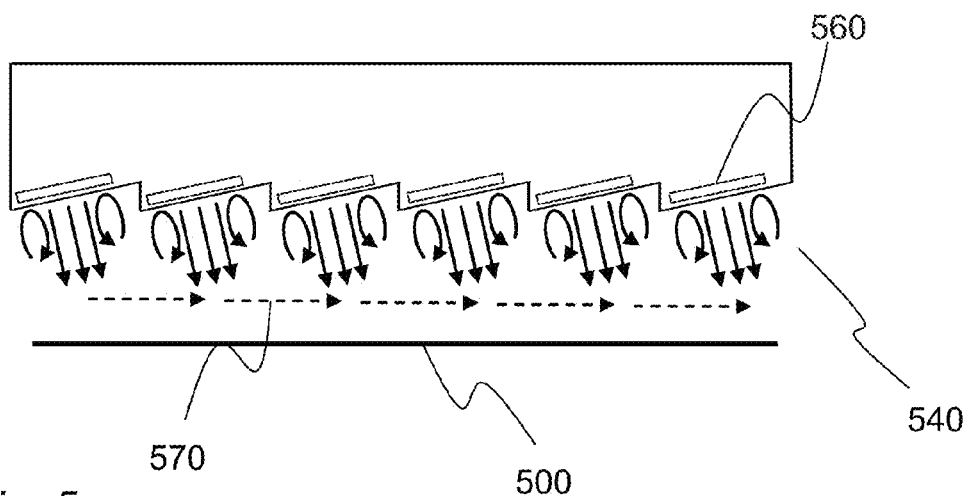
FIG. 5 shows an alternative configuration for an acoustic resonator assembly according to a further embodiment of the present invention.

FIG. 5 shows an alternative configuration for the body. The hypersonic building blocks 560, which consist of a defined amount of resonators, are tilted under a specific angle, between 0 and 45 degrees with respect to a substrate 500. This can create for instance a large scale streaming effect 570 in a preferential direction within a liquid 540.

Figure 6:
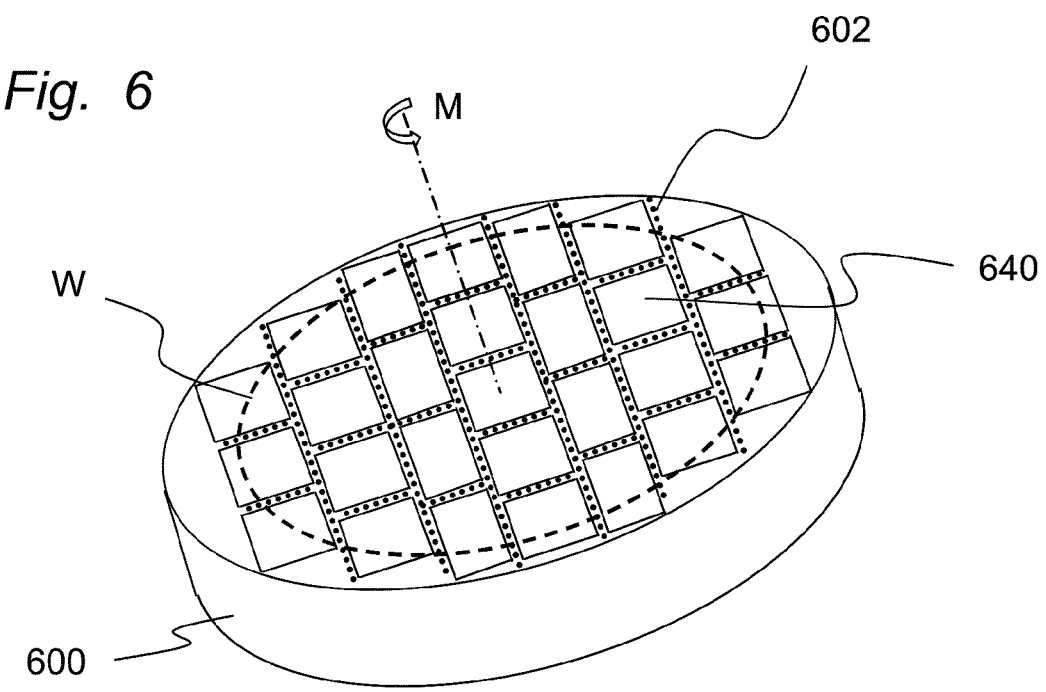
FIG. 6 shows yet another configuration for an acoustic resonator assembly according to a further embodiment of the present invention.

FIG. 6 is an example of a body 600, with a sequence of hypersonic building blocks 640, which comprises one or more resonators. The substrate W rotates about an axis M, with its upwardly-facing major surface parallel to the solid element and facing the resonators. Additionally, process liquids inlets 602 can be incorporated into the body 600 to supply the required amount of process liquid.

Figure 7:
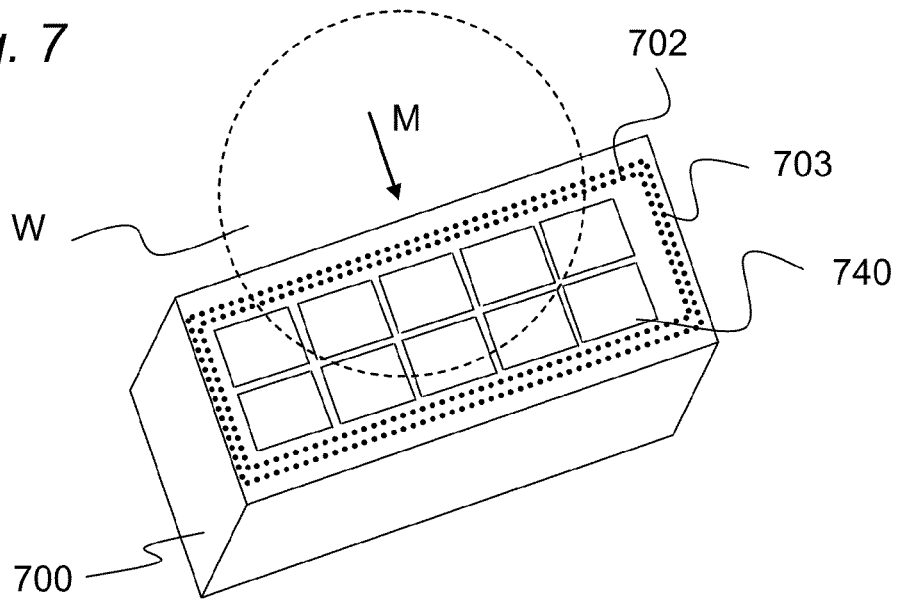
FIG. 7 shows a still further configuration for an acoustic resonator assembly according to an embodiment of the present invention.

An alternative design is given in FIG. 7, in which a body 700 has a sequence of hypersonic building blocks 740, which comprises one or more resonators. A series of process liquid inlets 702 and process liquid outlets 703 incorporated in body 700 allow the wetting and de-wetting of a substrate W while it moves linearly M over or under the resonator.

Figure 8:
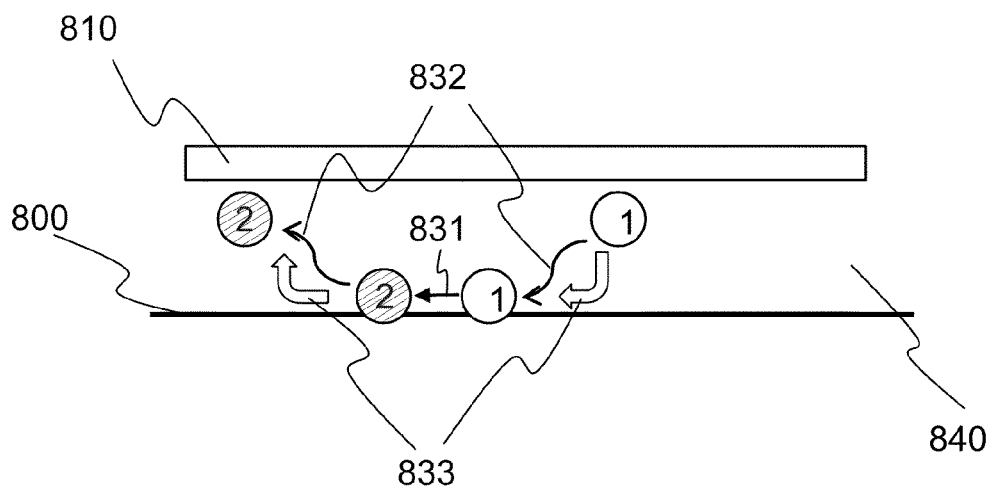
FIG. 8 shows an example of a diffusion limited heterogeneous reaction.

FIG. 8 shows an example of a diffusion limited heterogeneous reaction 831. In a first step, the reagent 1 diffuses 832 through the liquid 840 towards the solid surface 800 and it reacts 831 to form product 2. In a following step, the product 2 will diffuse away 832 from the surface. If this reaction is diffusion limited, the presence of the acoustic streaming 833, produced by the resonator 810, will enhance the diffusion of the reagent 1 towards the surface and the diffusion of the product 2 away from the surface.

Figure 9:
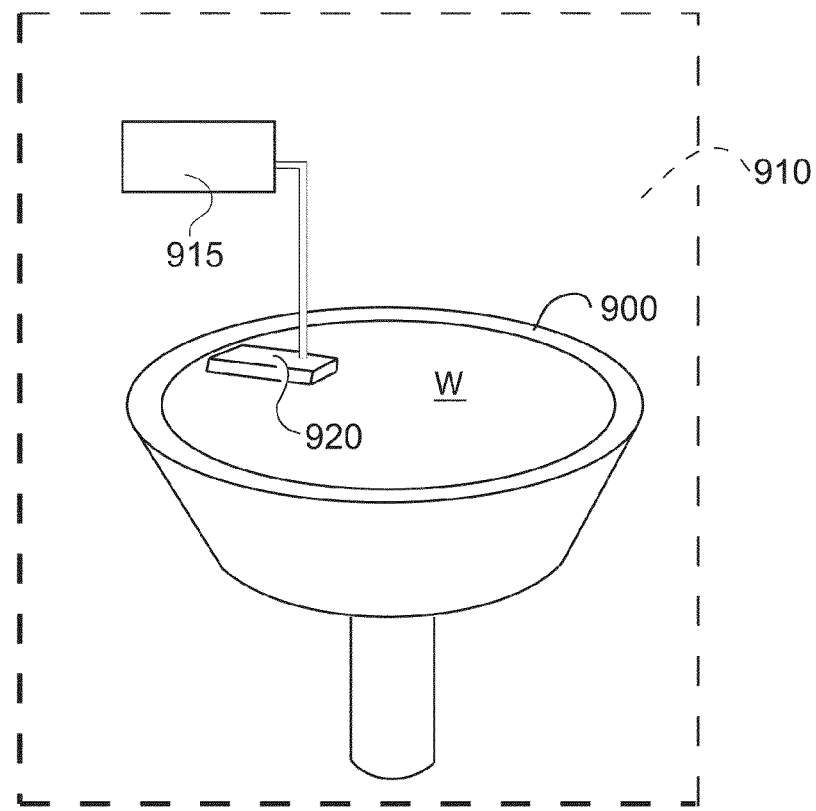
FIG. 9 schematically depicts an apparatus for single wafer wet processing equipped with an acoustic resonator assembly according to any of the foregoing embodiments.

FIG. 9 schematically depicts a resonator array 920, which could be constructed as described in connection with any of the foregoing embodiments or otherwise in accordance with the invention, positioned in relation to a substrate W, which in this instance is a semiconductor wafer, for example a 300 mm semiconductor wafer. Wafer W is positioned on a spin chuck 900, which in turn is mounted within a process module 910 for single wafer wet processing.

A frequency generator 915 drives the piezoelectric elements of the acoustic resonator assembly 920. If the acoustic resonator assembly is equipped with liquid supply openings as described above, then 915 may also constitute a fluid supply to those openings.

With reference for example to the embodiment of FIG. 1, when mounted in an apparatus as shown in FIG. 9, the process liquid 140 will be present in the space between upper surface of wafer W and the downwardly-facing surface of body 150, whereas the upwardly-facing surfaces of the acoustic resonator assembly will preferably be exposed to the gaseous ambient within the process chamber and not submerged in process liquid.

As noted above, it is preferred that the distance between the substrate and acoustic resonator assembly is between 100 μm and 1000 μm. The acoustic streaming induced by GHz-order resonators cannot exert the desired effect on heterogeneous processes such as cleaning, etching and deposition, if the distance between the resonator and substrate is too large (e.g., several millimetres).

The embodiments of the present invention described above allow controlling the introduction of streaming with high velocities within a small liquid volume close to a substrate without the need for as many moving parts, e.g., a jet or pumps, and without the need for the presence of acoustically stimulated bubbles, which can shield some of the areas to be processed or in case of transient cavitations may damage the surface of the substrate or structures present on the surface.

It will be understood that the foregoing description and specific embodiments shown herein are merely illustrative of the invention and the principles thereof, and that modifications and additions may be easily made by those skilled in the art without departing for the spirit and scope of the invention, which is therefore understood to be limited only by the scope of the appended claims.

What is claimed is:

1. An apparatus for treating a substrate, comprising:
a holder for the substrate;
an acoustic resonator assembly positioned so as to be spaced a predetermined distance from a substrate when held by the holder, said acoustic resonator assembly comprising at least one piezoelectric layer having a thickness in the range from 200 nm to 20 μm;
a dispenser for supplying liquid into a gap between the substrate when held by the holder and the acoustic resonator assembly,
wherein the acoustic resonator assembly comprises a solid resonator body that is located between the piezoelectric layer and liquid in the gap; and
a source of acoustic energy configured to supply said acoustic resonator assembly with acoustic energy having a frequency of at least about 100 MHz.

2. The apparatus according to claim 1, wherein the holder is a spin chuck for supporting a semiconductor wafer in a process module for single wafer wet processing.

3. The apparatus according to claim 1, wherein the source of acoustic energy supplies the acoustic resonator assembly with acoustic energy having a frequency in a range from 500 MHz to 5 GHz.

4. The apparatus according to claim 1, wherein the at least one piezoelectric layer has a thickness in the range from 500 nm to 10 microns.

5. The apparatus according to claim 1, wherein the acoustic resonator assembly is positioned relative to said holder such that, when a substrate is supported by said holder, the predetermined distance is in the range from 100 μm to 1000 μm.

6. The apparatus according to claim 1, wherein the at least one piezoelectric layer is a plurality of layers comprising at least one piezoelectric material selected from the group consisting of AlN, lead zirconium titanate (PZT), ZnO and GaAs, said plurality of layers being coupled to a resonator plate facing said holder; wherein the plurality of layers is in contact with a pair of electrodes, with a first electrode being positioned on one side of the plurality of layers, and a second electrode being positioned on an opposite side of the plurality of layers.

7. The apparatus according to claim 6, wherein the resonator plate comprises at least one material selected from the group consisting of sapphire, silicon and quartz.

8. A method of treating a substrate, comprising:
positioning a substrate on a holder;
positioning an acoustic resonator assembly a predetermined distance from a surface of the substrate, said acoustic resonator assembly comprising at least one piezoelectric layer having a thickness in the range from 200 nm to 20 μm;
dispensing a treatment liquid into a gap between the acoustic resonator assembly and the substrate,
wherein the acoustic resonator assembly comprises a solid resonator body that is located between the piezoelectric layer and liquid in the gap; and
supplying the acoustic resonator assembly with acoustic energy having a frequency of at least about 100 MHz.

9. The method according to claim 8, wherein the holder is a spin chuck for supporting a semiconductor wafer in a process module for single wafer wet processing.

10. The method according to claim 8, wherein the acoustic resonator assembly is supplied with acoustic energy having a frequency in a range from 500 MHz to 5 GHz.

11. The method according to claim 10, wherein the the at least one piezoelectric layer has a thickness in the range from 500 nm to 10 μm.

12. The method according to claim 8, wherein the predetermined distance is in the range from 100 μm to 1000 μm.

13. The method according to claim 11, wherein the at least one piezoelectric layer is coupled to a resonator plate facing the holder, and wherein the resonator plate comprises at least one material selected from the group consisting of sapphire, silicon and quartz.

14. The method according to claim 9, wherein the treatment liquid is a liquid for cleaning a surface of the semiconductor wafer selected from the group consisting of deionized water, alcohols, acids and bases.

15. The method according to claim 9, wherein the treatment liquid is a solution containing metal ions, preferably copper ions, for the electrodeposition of metal, preferably copper, onto a surface of the semiconductor wafer.

16. The apparatus according to claim 1, wherein the at least one piezoelectric layer has a thickness in the range from 1-5 microns.

17. An apparatus for treating a substrate, comprising:
a holder for the substrate;
an acoustic resonator assembly positioned so as to be spaced 100 μm to 1000 μm from a substrate when held by the holder;
a dispenser for supplying liquid into a gap between the substrate when held by the holder and the acoustic resonator assembly,
wherein the acoustic resonator assembly comprises a solid resonator body that is located between the piezoelectric layer and liquid in the gap; and
a source of acoustic energy configured to supply said acoustic resonator assembly with acoustic energy having a frequency in a range from 500 MHz to 5 GHz;
wherein said acoustic resonator assembly comprises at least one piezoelectric layer having a thickness in the range from 500 nm to 10 μm and a resonator body having a thickness in the range from 20 microns to 675 microns.

* * * * *